United States Patent
Shaw et al.

(10) Patent No.: US 9,321,626 B2
(45) Date of Patent: Apr. 26, 2016

(54) METHOD OF PACKAGING A MEMS TRANSDUCER DEVICE AND PACKAGED MEMS TRANSDUCER DEVICE

(71) Applicant: STMicroelectronics S.r.l., Agrate Brianza (IT)

(72) Inventors: Mark Andrew Shaw, Milan (IT); Fabrizio Soglio, Varese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/224,861

(22) Filed: Mar. 25, 2014

(65) Prior Publication Data

US 2014/0291781 A1    Oct. 2, 2014

(30) Foreign Application Priority Data

Mar. 26, 2013   (IT) ................ TO2013A0247

(51) Int. Cl.
| | |
|---|---|
| *H01L 29/84* | (2006.01) |
| *B81B 7/00* | (2006.01) |
| *H04R 19/00* | (2006.01) |
| *H04R 19/02* | (2006.01) |
| *H04R 31/00* | (2006.01) |
| *B81C 1/00* | (2006.01) |

(52) U.S. Cl.
CPC .......... *B81B 7/0032* (2013.01); *B81C 1/00261* (2013.01); *H01L 29/84* (2013.01); *H04R 19/005* (2013.01); *H04R 19/02* (2013.01); *H04R 31/00* (2013.01)

(58) Field of Classification Search
CPC .. H01L 29/84; B81B 7/0032; B81C 1/00261; H04R 19/005; H04R 31/00
See application file for complete search history.

(56) References Cited

U.S. PATENT DOCUMENTS

| | | | | |
|---|---|---|---|---|
| 5,994,161 | A * | 11/1999 | Bitko et al. ............... | 438/53 |
| 6,462,392 | B1 * | 10/2002 | Pinter et al. .............. | 257/420 |
| 8,155,355 | B2 * | 4/2012 | Ogura et al. .............. | 381/174 |
| 2001/0028072 | A1 * | 10/2001 | Aoki et al. ............... | 257/254 |
| 2005/0095814 | A1 * | 5/2005 | Zhu et al. ................. | 438/459 |
| 2005/0189635 | A1 * | 9/2005 | Humpston et al. ....... | 257/678 |
| 2006/0169049 | A1 | 8/2006 | Matsubara | |

(Continued)

FOREIGN PATENT DOCUMENTS

EP     2 360 942 A2    8/2011

OTHER PUBLICATIONS

Klug, "Advanced Solutions for Ultra-Thin Wafers and Packaging," 2009 European Microelectronics and Packaging Conference (EMPC 2009), Rimini, Jun. 15-18, 2009, 4 pages.

*Primary Examiner* — Michele Fan
(74) *Attorney, Agent, or Firm* — SEED INTELLECTUAL PROPERTY LAW GROUP PLLC

(57) ABSTRACT

A packaged MEMS transducer device comprising: a die, including: a semiconductor body having a front side and a back side, opposite to one another in a first direction, at least one cavity extending through the semiconductor body between the front side and the back side, and at least one membrane extending on the front side at least partially suspended over the cavity; and a package designed to house the die on an inner surface thereof. The transducer device moreover includes a sealing layer extending on the back side of the semiconductor body for sealing the cavity, and includes a paste layer extending between the sealing layer and the inner surface of the package for firmly coupling the die to the package.

14 Claims, 8 Drawing Sheets

(56) References Cited

U.S. PATENT DOCUMENTS

2007/0161139 A1* 7/2007 Loeppert .................. 438/48
2008/0315333 A1* 12/2008 Combi et al. .............. 257/415
2009/0232336 A1* 9/2009 Pahl ......................... 381/175
2010/0284553 A1* 11/2010 Conti et al. ............... 381/174
2010/0290199 A1* 11/2010 Schmid et al. ............ 361/752
2010/0303273 A1   12/2010 Sawada
2011/0204745 A1*  8/2011 Omura et al. ............. 310/300
2012/0146163 A1*  6/2012 Ho et al. ................... 257/416
2012/0235252 A1*  9/2012 Pinter ....................... 257/415

* cited by examiner

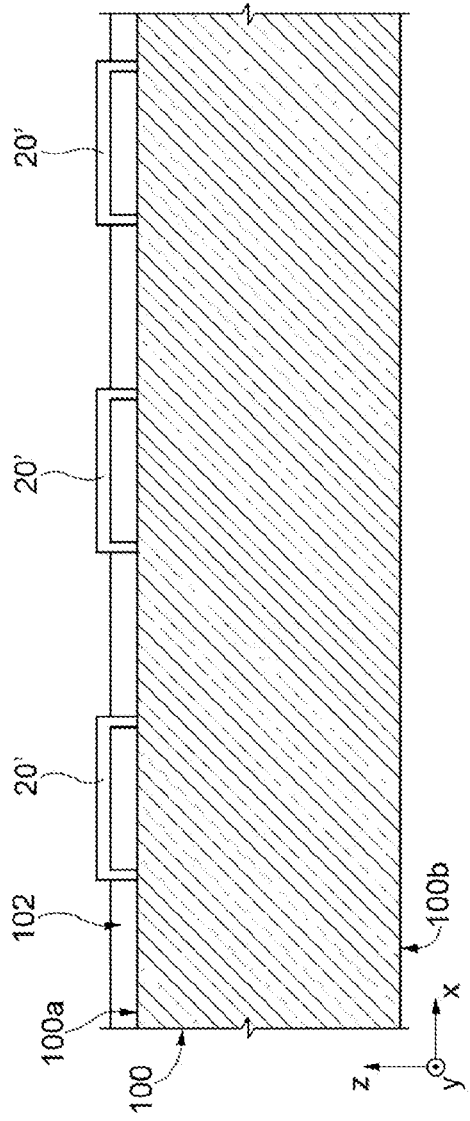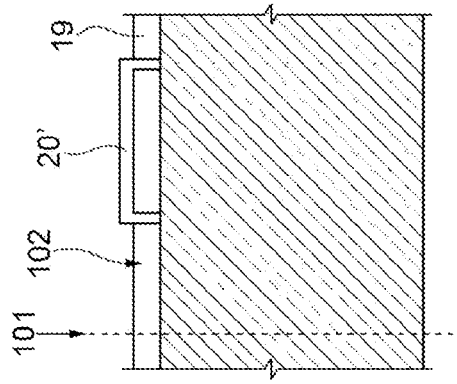
FIG. 5
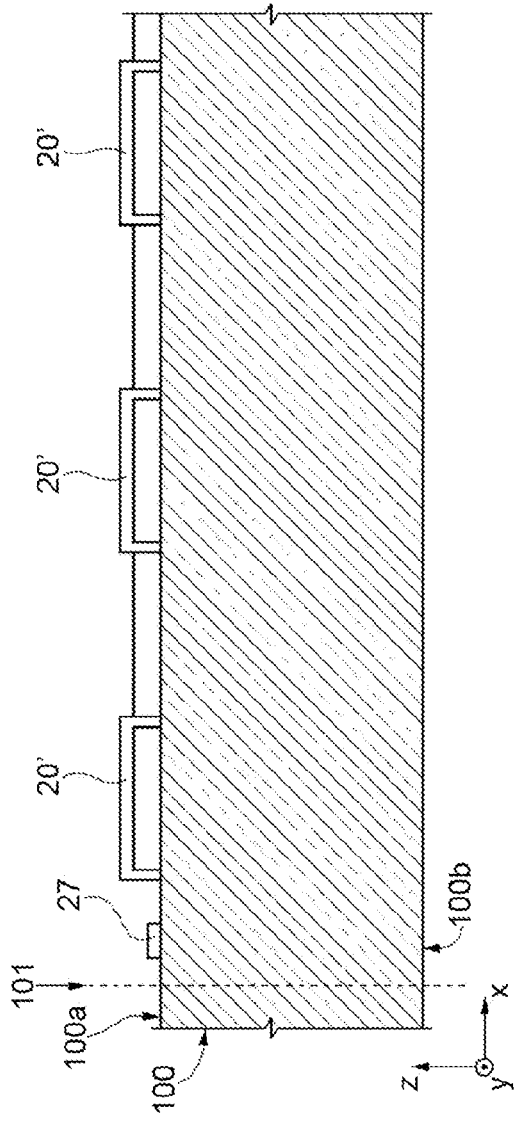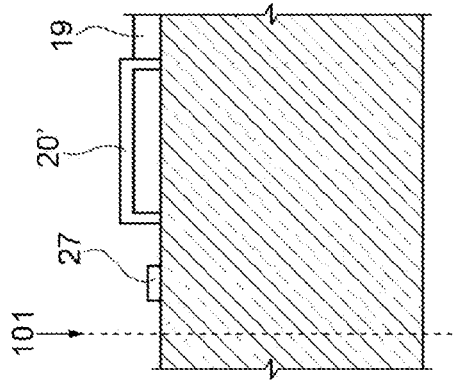
FIG. 6

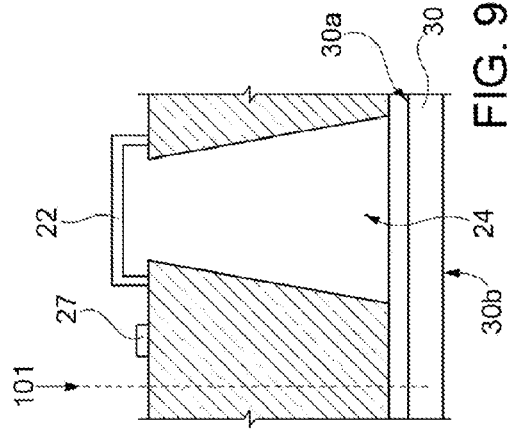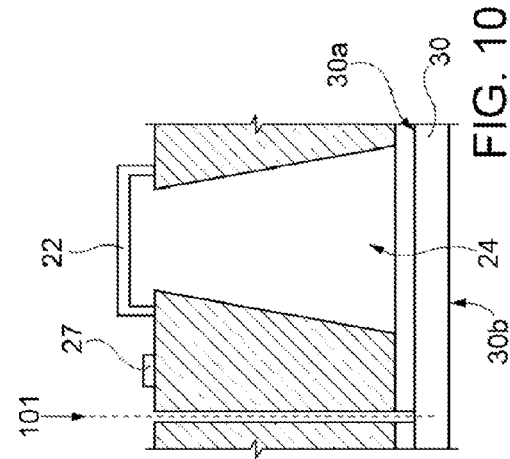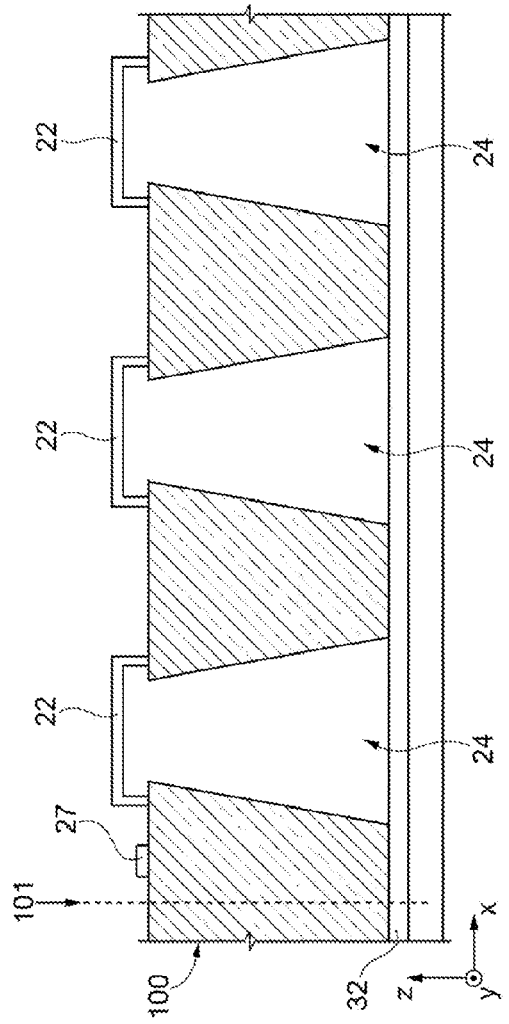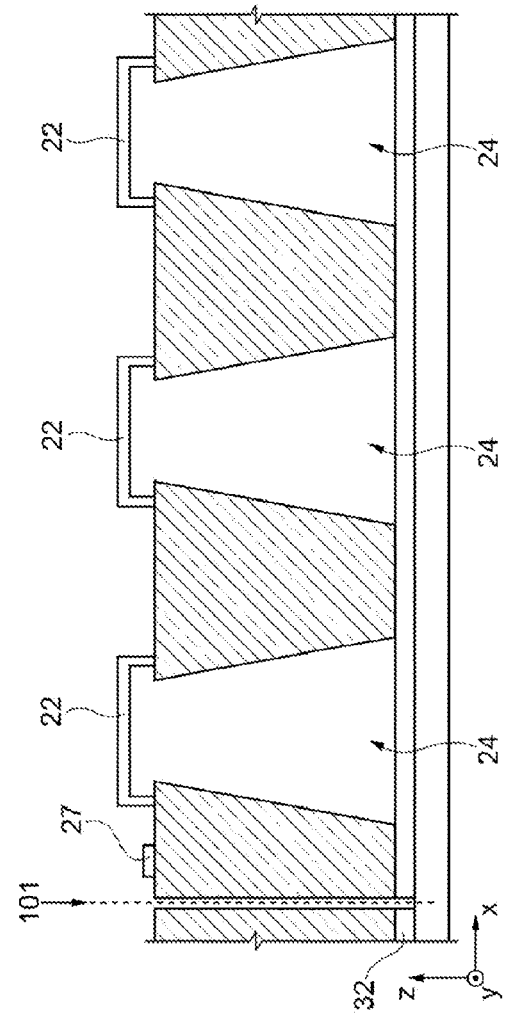

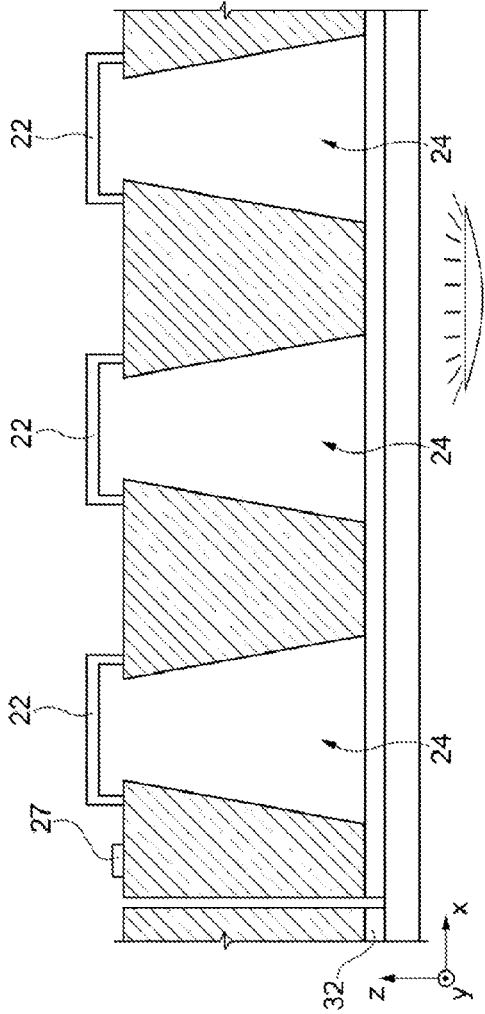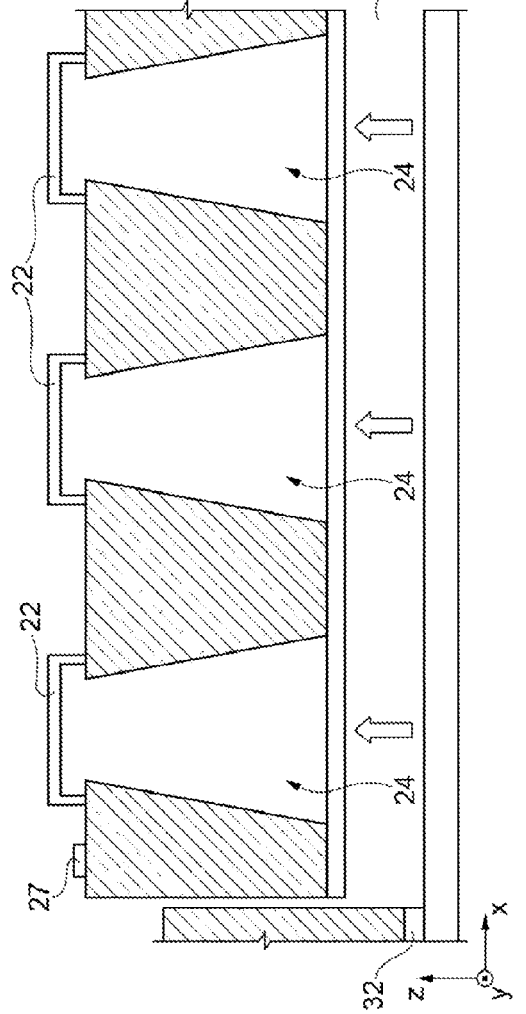
FIG. 11
FIG. 12

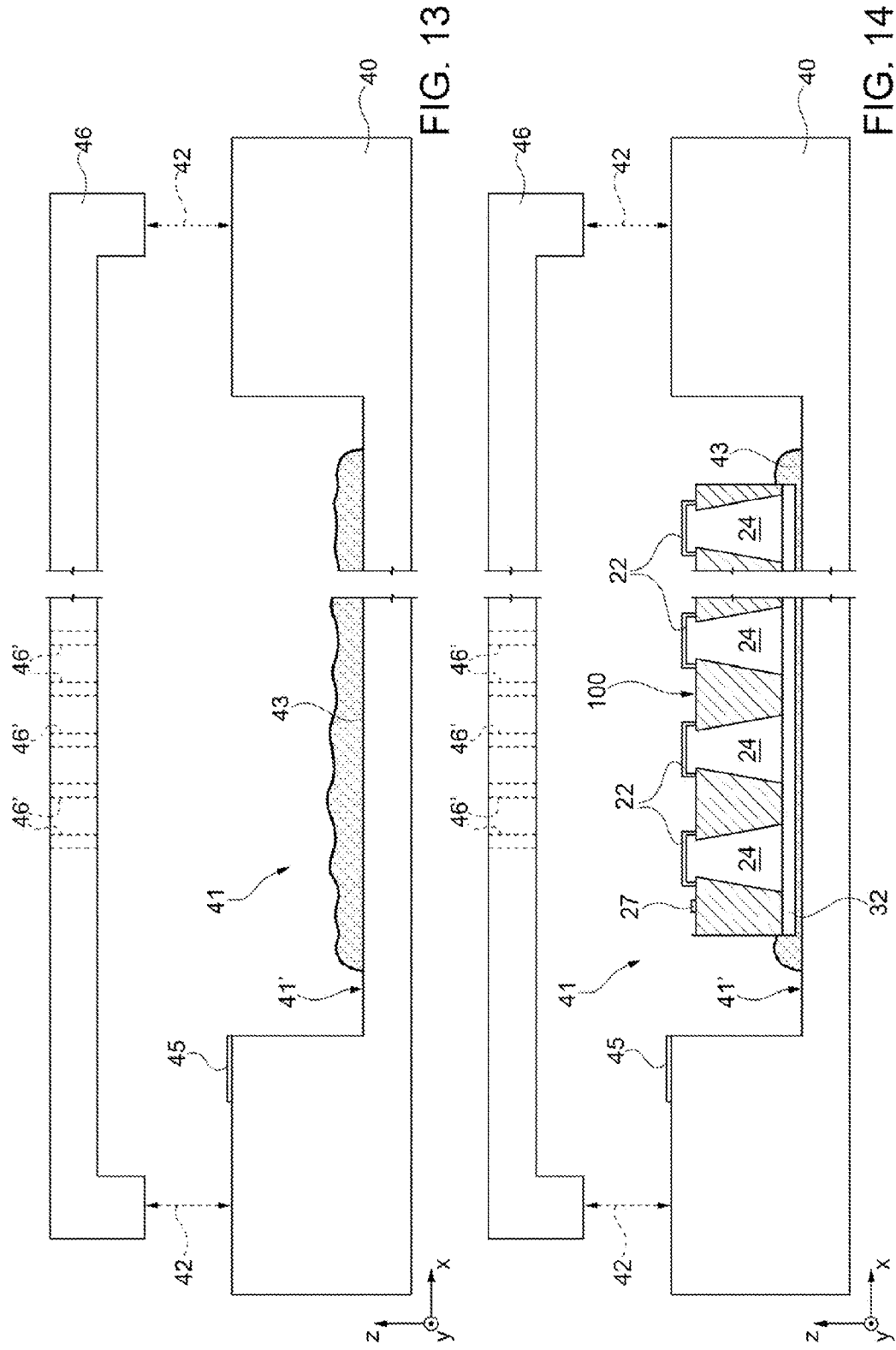

METHOD OF PACKAGING A MEMS TRANSDUCER DEVICE AND PACKAGED MEMS TRANSDUCER DEVICE

BACKGROUND

1. Technical Field

The present disclosure relates to a method of packaging a MEMS transducer device and to a packaged MEMS transducer device. The MEMS transducer device is, in particular, a membrane-based speaker.

2. Description of the Related Art

FIG. 1 shows, in top plan view, a MEMS speaker 1 comprising a plurality of membranes 2, which are arranged so as to form a planar array 3. For example, the MEMS speaker 1 is formed by 1024 membranes, arranged in thirty-two rows and thirty-two columns. Each membrane 2 forms a speaker unit 10 (also known as "pixel"), which can be driven selectively by respective conductive pads 5.

FIG. 2 shows, according to a cross-sectional view taken along the line of section II-II of FIG. 1, a membrane-based MEMS transducer, for example a MEMS speaker 1. For reasons of simplicity of representation, FIG. 2 shows a semiconductor body 9 including a plurality of membranes 2, but the means for actuation of such membranes 2 for generating, in use, sound waves are not illustrated. Known to the art are MEMS speakers provided with membranes 2 actuated by means of electrodes appropriately biased (electrostatic actuation), or else MEMS speakers provided with piezoelectric actuators, which are set fixed with respect to the membranes 2 and can be actuated so as to generate controlled deflections of the membranes 2 themselves. Irrespective of the actuation method, the controlled movement of the membranes 2 (in the direction Z) generates sound waves, according to the known operation of a speaker. Each membrane 2 of the MEMS speaker 1 is suspended over a respective cavity 14. Each cavity 14 is separated, from cavities 14 adjacent thereto, by walls 12 of the semiconductor body 9. In use, each cavity 14 has the function of acoustic cavity (or resonant cavity) of the MEMS speaker 1. It is evident that the dimensions of each cavity 14 are designed to optimize the characteristics of the sound generated by the MEMS speaker 1 during use.

At the end of the steps of machining of the semiconductor body 9 (in particular, formation of the membranes 2 and of the cavities 14), the MEMS structure thus obtained is housed in a package 16 so as to support it and protect it.

It is expedient for the steps of coupling of the semiconductor body 9 with the package 16 not to modify the internal volume of the cavities 14 (in particular, reducing it). Use of epoxy-based, or polyamide-based, or acrylic-based glues or resins, or other glues typically used for bonding semiconductor substrates or wafers, does not meet the aforementioned preferences. Once again with reference to FIG. 2, represented schematically therein is the effect of reduction of the internal volume of the cavities 14 on account of the use of resins of a known type. The resin or glue used extends as far as the interface between the portion of package 16 to which the semiconductor body 9 is coupled (interface regions 18') and also laterally to such interface 18', partially rising within the cavities 14 (lateral regions 18") and partially filling the cavities 14.

A possible solution to this problem is the use, as an alternative to resins or glues, of biadhesive tapes, for example die-attach films (DAFs). However, the biadhesive tapes currently present on the market are characterized by a Young's modulus (or elastic modulus) of a relatively high value (typically between approximately 200 and 800 MPa, according to the type of tape used), and cause warpage of the MEMS speaker 1, and in particular of the membranes 2, which is not easy to control. A deformation of the membranes 2 seriously jeopardizes the acoustic characteristics of the MEMS speaker 1 and is consequently a markedly undesirable effect.

BRIEF SUMMARY

One or more embodiments of the present disclosure are directed to a method for packaging a MEMS transducer device and a packaged MEMS transducer device.

One embodiment includes a packaged MEMS transducer device comprising a die that includes a semiconductor body having a front side and a back side opposite to one another in a first direction. The die further includes at least one cavity that extends through said semiconductor body between the front side and the back side. The die may also include at least one membrane that extends at the front side, at least partially suspended over said cavity, and a sealing layer located on the back side of the semiconductor body for sealing said cavity. The packaged MEMS transducer device further including a package for housing the die, the package having an inner surface and said die located on the inner surface. The packaged MEMS transducer device further including a paste layer located between the sealing layer and said inner surface of said package for coupling the die to the package.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIGS. 3-7 show steps of manufacture of a wafer including a plurality of transducers;

FIGS. 9-12 show steps of dicing of the wafer of FIG. 7 for singulating a plurality of dice, according to one aspect of the present disclosure;

FIGS. 13-15 show steps for packaging a die, following upon the steps of FIGS. 9-12, according to one aspect of the present disclosure.

DETAILED DESCRIPTION

FIGS. 3-6 show steps of a method of machining of a wafer 100 of semiconductor material, for producing a plurality of MEMS structures that, following upon steps of dicing and packaging, will form respective MEMS speakers (or, in general, acoustic transducers). The steps of FIGS. 3-6 do not form part of the present disclosure, and are carried out in a known way. However, they are briefly described herein in order to contextualize better the present disclosure.

Figure 3:
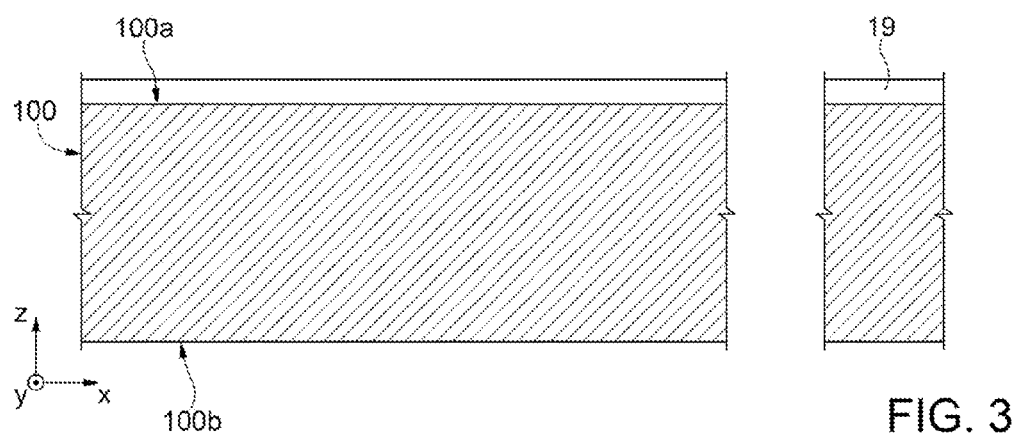

With reference to FIG. 3, the wafer 100 of semiconductor material, for example silicon, is provided, having a front side 100a and a back side 100b, opposite to one another in the direction Z. The wafer 100 has a thickness comprised between approximately 400 μm and 700 μm, for example, 550 μm. The wafer 100 is, for example, of a previously machined type, and comprises one or more layers of semiconductor and/or insulating and/or conductive material, here not illustrated in detail.

In particular, an insulation layer 19, for example silicon oxide having a thickness comprised between 1 μm and 3 μm, is grown over the front side 100a of the wafer 100.

Figure 2:
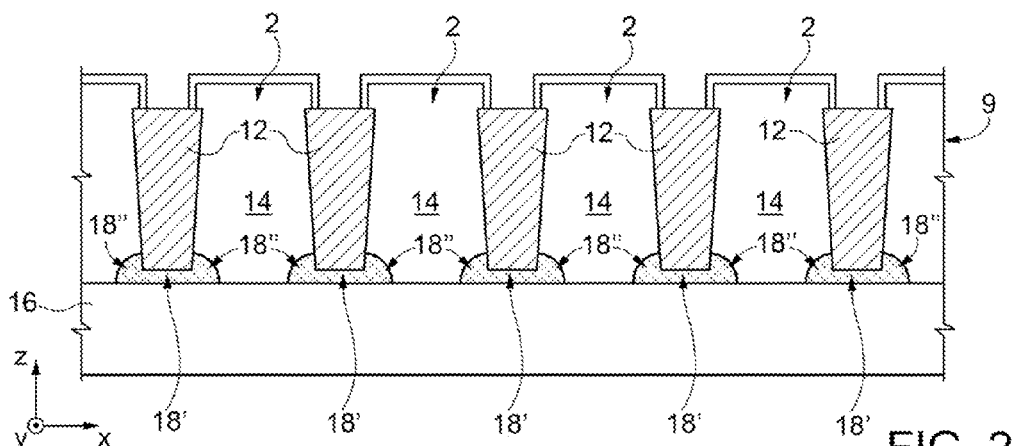
FIG. 2 shows, in cross-sectional view, a portion of a transducer of a known type.
Figure 4:
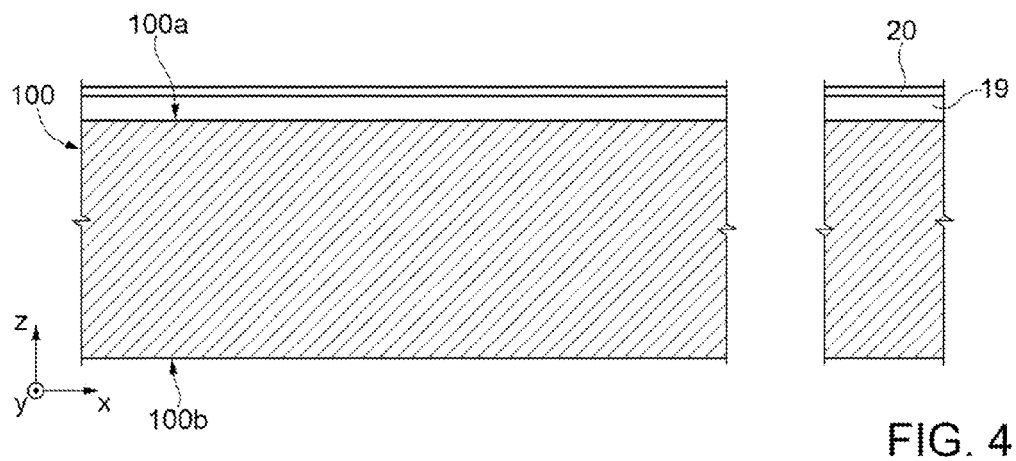

With reference to FIG. 4, a membrane layer 20, for example polysilicon, is deposited on the wafer 100 over the insulation layer 19. Since, as will be better described in what follows, the membrane layer 20 forms suspended membranes 22 (similar to the membranes 2 of FIG. 2), its thickness is chosen in such a way as to obtain desired values of flexibility and mechanical solidity of the membranes 22. For example, the membrane layer 20 may have a thickness comprised between 1 and 5 μm, for example approximately 3 μm. According to one embodiment, prior to the step of deposition of the membrane layer 20, the insulation layer 19 is selectively removed in regions in which it is desired to form membrane-anchorage portions (typically, at edge regions of the membranes 22). In this way, the step of deposition of the membrane layer 20 comprises simultaneous formation of the anchorages through the insulation layer 19.

With reference to FIG. 5, by means of successive steps of lithography and etching, for example using a dry etch, the membrane layer 20 is selectively removed except for the areas in which the membranes 22 are to be formed, to form intermediate membrane regions 20'. In greater detail, the membrane layer 20 is removed along scribe lines 101 of the wafer 100, and in surface regions 102 of the wafer 100 in which conductive pads are to be formed for supplying, in use, electrical signals for control of a respective MEMS speaker.

As illustrated in FIG. 6, in order to form the conductive pads, the insulation layer 19 is selectively etched at the surface regions 102 (and, in the example illustrated, also along the scribe lines 101), to expose respective portions of the front side 100a of the wafer 100. Then, a step of deposition and definition of conductive material, for example metal, enables formation of conductive pads 27 on the wafer 100.

Figure 7:
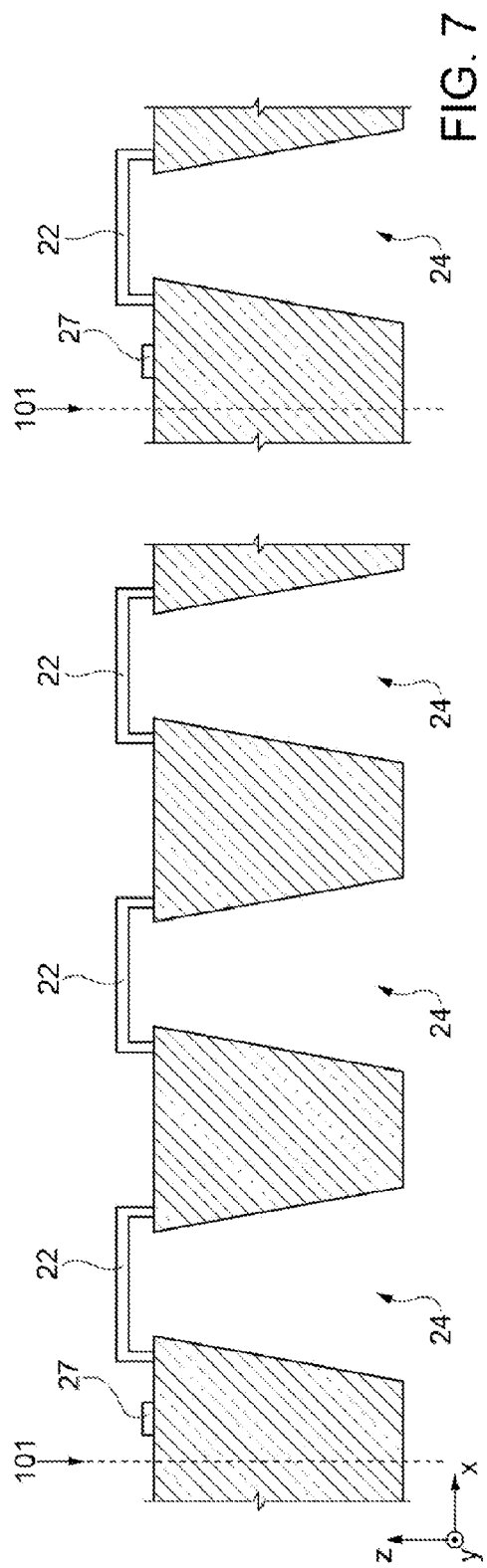

As shown in FIG. 7, the wafer 100 is etched (e.g., using the DRIE technique) on the back side 100b, for removing selective portions of the wafer 100 in the intermediate membrane regions 20'. A plurality of cavities 24 is thus formed in the wafer 100, extending from the back side 100b towards the insulation layer 19. In this example, the insulation layer 19 functions as etch-stop layer.

A further etch (e.g., a wet etch) both on the front side 100a and on the back side 100b of the wafer 100 enables complete removal of the insulation layer 19, and possible other insulation layers or sacrificial layers, which surround the intermediate membrane regions 20, thus leading to the formation of the membrane 22, suspended over respective cavities 24.

With reference to FIGS. 3-7, manufacturing steps for the formation of actuators means for moving, in use, the membranes 22 are not illustrated or described. Such steps may comprise, in the case of electrostatic actuation, formation of top and bottom electrodes of the type described hereinafter with reference to FIG. 8, and configured for being biased so as to move the membranes 22 during use. Furthermore, other types of actuation of the membrane may be envisaged, different from the one described with reference to FIG. 8. For example, each membrane may be of a type with piezoelectric actuation and comprise, as an alternative to the top and bottom electrodes extending at a distance from the respective membrane 22, one or more piezoelectric elements formed in contact with each membrane, electrically coupled to respective pads 27, and actuated by means of electrical signals so as to generate a displacement of the respective membrane 22.

It is here pointed out that the steps of manufacture of the membrane and of the actuators of the membranes are known in the prior art and do not form the subject of the present disclosure; hence, they are not described herein in further detail.

Figure 8:
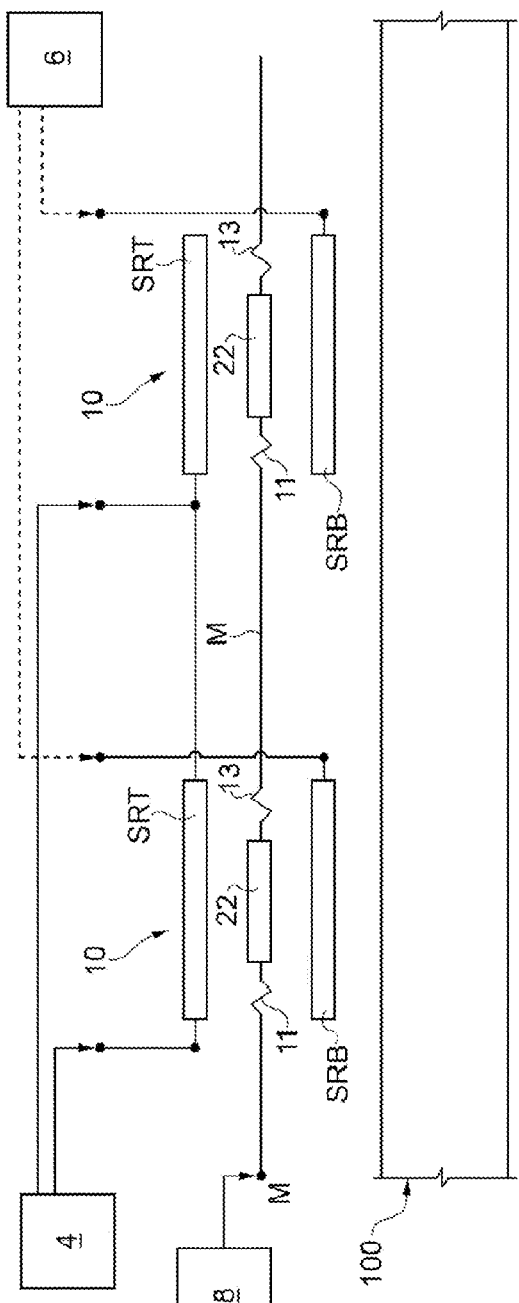
FIG. 8 is a schematic representation of an embodiment of means for actuation of the transducers of FIG. 7.

FIG. 8 is a schematic illustration of a MEMS transducer, in particular a MEMS speaker, that can be actuated electrostatically (for example, produced following the process outlined with reference to FIGS. 2-7). For this purpose, the MEMS speaker of FIG. 8 comprises for each membrane 22, a top electrode T and a bottom electrode B. A top-electrode driving circuit 4 and a bottom-electrode driving circuit 6 may be provided in integrated form in the wafer 100 or external thereto, indifferently.

The top-electrode driving circuit 4 and bottom-electrode driving circuit 6 are configured for biasing the top electrode T and bottom electrode B between respective supply voltages $V_D$ and respective reference voltages $V_{REF}$ (e.g., ground voltage), for example through respective pads 27.

The MEMS speaker of FIG. 8 further comprises a membrane electrode M, which is connected to the membranes 22. In addition, the MEMS speaker comprises a membrane-electrode driving circuit 8.

According to one embodiment, the top electrodes T and the bottom electrodes B are fixed with respect to the wafer 100.

Each top electrode T is formed by a plurality of top-electrode subregions SRT (or top plates), each of which overlies, at a distance, a corresponding membrane 22. Furthermore, each top-electrode subregion SRT is made of electrically conductive material. Likewise, each bottom electrode B is formed by a plurality of bottom-electrode subregions SRB (or bottom plates), each of which is set underneath a corresponding membrane 22, at a distance from the latter. Furthermore, each bottom-electrode subregion SRB is made of electrically conductive material.

The top and bottom electrodes T, B and the respective membrane 22 form a column in the direction Z orthogonal to X, and are substantially aligned to one another in the direction Z. Each membrane 22 is mobile with respect to the corresponding top-electrode subregion SRT and to the corresponding bottom-electrode subregion SRB, and is hence mobile with respect to the bottom electrode B and top electrode T of its own column. For this purpose, each membrane 22 is connected to the corresponding membrane electrode M through a first spring 11 and a second spring 13, in a known way. In this way, in use, each membrane 22 can move in the direction Z alternatively approaching, or receding from, the top-electrode subregion SRT and the bottom-electrode subregion SRB, under the electrostatic force generated by an appropriate biasing of the top-electrode subregion SRT and the bottom-electrode subregion SRB.

In fact, in use, the voltages of the bottom and top electrodes B, T and of the membrane electrodes M are set in such a way that the membranes 22 are subject to electrostatic forces that cause movement thereof in the direction Z, alternatively towards the corresponding top plates SRT, or else towards the corresponding bottom plates SRB.

In practice, each membrane 22 is mobile between:

(i) a first position, where the membrane 22 is at a short distance from the bottom-electrode subregion SRB (or, in other words, at a distance b1 from the bottom-electrode subregion SRB) and is set at a distance from the corresponding top-electrode subregion SRT (or, in other words, at a distance b2>b1 from the top-electrode subregion SRT); and (ii) a second position, where the membrane 22 is at a short distance from the top-electrode subregion SRT (or, in other words, at a distance t1 from the top-electrode subregion SRT)

and is at a distance from the corresponding bottom-electrode subregion SRB (or, in other words, at a distance t2>t1 from the bottom-electrode subregion SRB).

Figure 1:
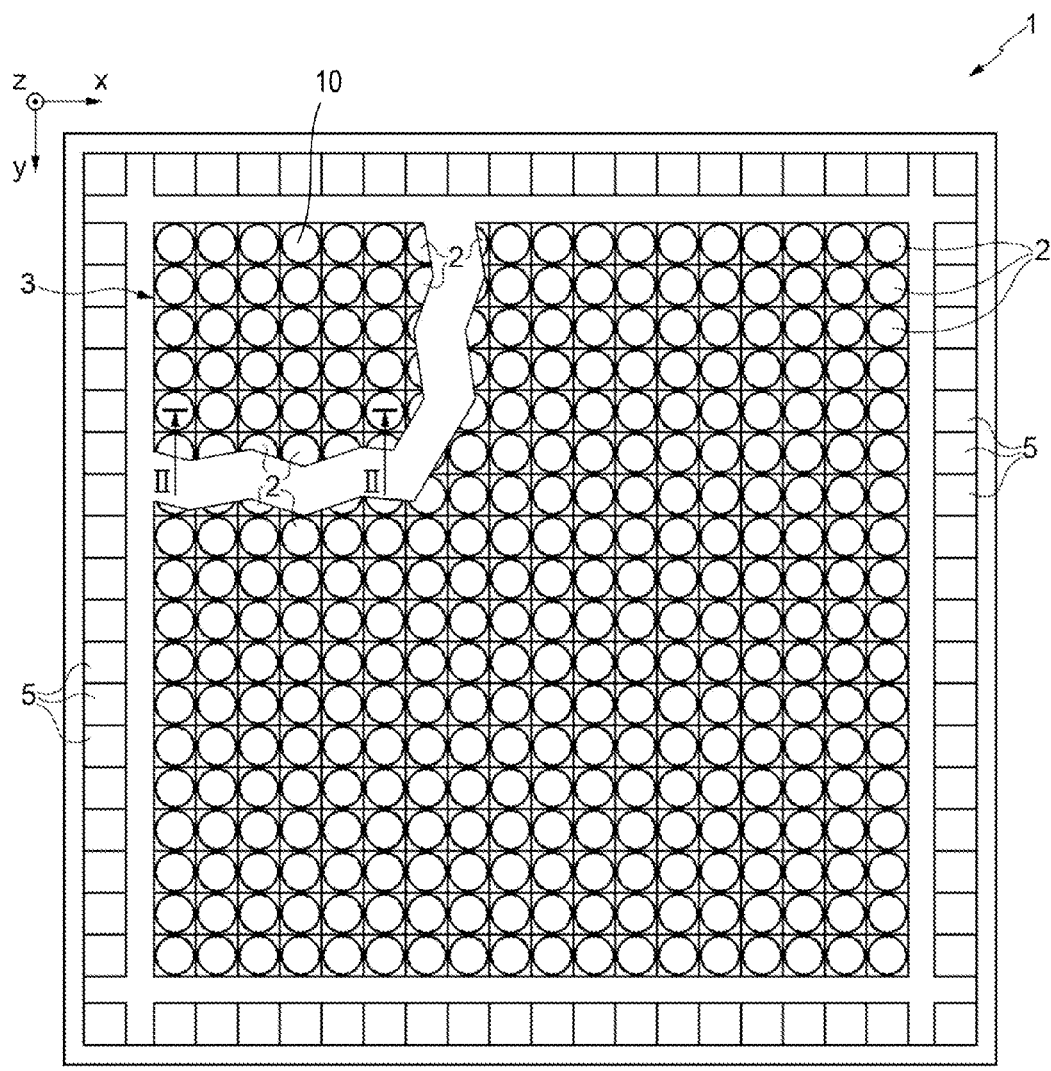
FIG. 1 shows, in top plan view, a die of a transducer of a known type.

In use, each membrane 22 is hence made to oscillate between the aforementioned first and second positions, in such a way that each membrane 22 generates an acoustic wave, which is perceptible by a listener. In practice, each membrane 22, appropriately actuated, is able to transduce electrical signals into a respective elementary acoustic wave, where the set of the elementary acoustic waves generated by the plurality of membranes 22 form the acoustic wave as a whole emitted by the MEMS speaker. The membranes 22 of one and the same MEMS speaker are, for example, arranged in an array, as represented in FIG. 1, where the pads 5 of FIG. 1 correspond to the pads 27 of FIG. 7, and the membranes 2 of FIG. 1 correspond to the membranes 22 of FIG. 7.

According to one aspect of the present disclosure, with reference to FIGS. 8-11, steps of dicing of the wafer 100 along the scribe lines 101 are carried out in order to singulate a plurality of dice, each of which forms an independent MEMS speaker.

In greater detail (FIG. 9), a support 30 is provided, for example a substrate of bismaleimide (B) triazine (T), also known as a "BT substrate". The support 30 has a first surface 30a and a second surface 30b opposite to one another, and an area in the plane XY equal to or greater than the area, in the plane XY, of the wafer 100. Laid on the first surface 30a of the support 30 is a sealing layer 32 of a biadhesive type, such as a DAF adhesive tape, in itself known and available on the market.

Then, the wafer 100 is positioned on the sealing layer 32, in contact with the latter, in such a way that the wafer 100 adheres to the support 30 via the sealing layer 32.

The sealing layer 32 has, for example, a thickness comprised between approximately 5 μm and 50 μm. The use of a DAF tape as sealing layer 32 affords a uniform covering of the entire first surface 30a. The method of laying of the sealing layer 32 obviously depends upon the type of adhesive layer, or DAF tape, used. For example, some DAF tapes utilize a step of laying by lamination. Also the laying temperature depends upon the type of DAF tape used.

The method of laying of a DAF tape, for improving adhesion between a wafer to be diced and a supporting substrate for dicing, is known in the state of the art.

As shown in FIG. 10, the step of dicing of the wafer 100 and of the sealing layer 32 is carried out, proceeding in depth as far as the support 30, scoring it at least partially. Dicing is carried out along the scribe lines 101 schematically illustrated in FIG. 7. Dicing is carried out, for example, by LASER (LASER-cutting or LASER-beam-dicing process). Other dicing methods may be used, for example the stealth-dicing method.

A plurality of dice 36 are thus formed, separate from one another, each die 36 including a respective plurality of membranes 22 of the type previously described and corresponding biasing pads 27.

As shown schematically in FIG. 11, a step of exposure to UV radiation is carried out to reduce the force of adhesion of the DAF tape 32 with respect to the support 30. In this way, the step of picking up of each die 36, separating it from the support 30, is facilitated. According to the type of DAF tape used, the step of exposure to UV radiation to reduce the force of adhesion of the DAF tape 32 with respect to the support 30 may be omitted, or replaced by another step designed to reduce the force of adhesion of the DAF tape 32 with respect to the support 30. For example, the step of separation of the DAF tape may be carried out by means of the known method of cool expansion. For this purpose, the support 30 along with the wafer 100 is set in a cooling chamber at a temperature of approximately 0° C. This step facilitates detachment of the DAF tape from the support 30. At room temperature, the DAF tape recovers its original elastic properties, adhering to the back 100b of the substrate 100 so as to close the cavities 24.

The document entitled "Advanced Solutions for Ultra-Thin Wafers and Packaging", by Gerald Klug, DISCO HI-TEC EUROPE GmbH, Liebigstrasse 8 D-85551, Kirchheim b. Munchen describes various process flows for implementing dicing techniques of a known type, also in the presence of DAF tapes.

FIG. 12 is a schematic illustration of a step of picking of a die 36, the latter including a portion (after dicing) of the wafer 100 and a respective portion of sealing layer 32 fixed with respect to the die 36.

As illustrated in FIG. 12, the sealing layer 32 extends on the back of the die 36, closing each cavity 24 on the back side of the die 36.

Next (FIGS. 13-15), illustrates steps of coupling between each die 36 and a corresponding housing of a package 16 is carried out.

In particular (FIG. 13), a first portion 40 of a package 16 is provided, having the function of housing a die 36 in a recess 41 formed in the first portion 40. The package 16 is of a type in itself known and comprises, for example, the first portion 40 and a second portion 46 configured for being coupled (arrows 42) to the first portion 40 so as to cover and protect, from possible external agents, the die 36 housed in the recess 41.

In order to improve adhesion between the die 36 and the bottom 41' of the recess 41, at the bottom 41' of the recess 41, one or more layers of glue or resin or adhesive paste are applied (in what follows, without limitation of the present disclosure, the term "adhesive paste", identified by the reference number 43, is used). For example, an epoxy-based, or polyamide-based, or acrylic-based adhesive glue or resin or adhesive paste is used, or one of another still, according to the need and availability, for example deposited using a syringe. Preferably, the adhesive paste or glue used has a low value of Young's modulus (or elastic modulus), for example comprised between 0.1 MPa and 30 MPa when measured at room temperature (approximately 25° C.), in particular lower than approximately 10 MPa, even more in particular approximately 1 MPa. Such a value of elastic modulus does not generate problems of warpage of the membranes 22.

Then (FIG. 14), the die 36 is housed inside the recess 41, in such a way that the side of the die 36 protected by the sealing layer 32 faces the bottom 41' of the recess 41. The die 36 is pressed towards the bottom 41' of the recess 41 so as to come into contact with the adhesive paste 43. The adhesive paste 43 does not penetrate through the sealing layer 32 and, hence, does not reach the inside of the cavities 24 of the die 36.

A step of thermal treatment of the adhesive paste 43 is then carried out to improve hardening of the adhesive paste 43 and fixing of the die 36 to the first portion 40 of the package 16. The temperature of thermal treatment depends, obviously, upon the type of adhesive paste used. It is evident that, in the case of use of an adhesive paste that does not utilize a thermal treatment, this step may be omitted.

Finally (FIG. 15), the process is completed by a step of "wire bonding" to form electrical connections 49 between the pads 27 of the die 36 and respective pads 45 of the package 16. Next, the portions 40 and 46 of the package are set in contact with one another and sealed.

The pads 45 of the package 16 are provided with electrical connections towards the outside of the package 16 so that, when the first and second portions 40, 46 are coupled together, the pads 27 of the die 36 may be biased from the outside of the package 16. The MEMS speaker may thus be operated according to the need. The second portion 46 includes access holes 46', extending through the second portion 46 to allow the sound waves generated, in use, by the MEMS speaker, to propagate outside the package 16.

Figure 16:
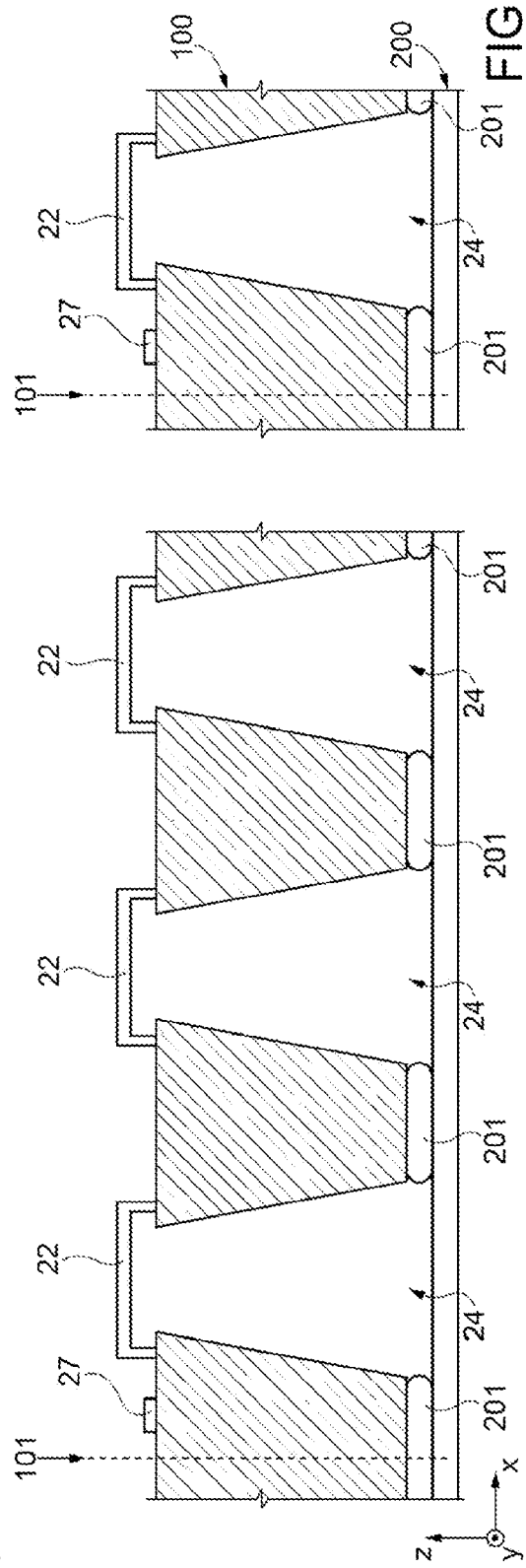
FIG. 16 shows a wafer according to a further embodiment of the present disclosure.

With reference to FIG. 16, according to a further embodiment of the present disclosure, the sealing layer 32 is a layer of semiconductor material, for example silicon, coupled to the back side 100b of the wafer 100. Coupling between a sealing layer 32 of semiconductor material and the wafer 100 is carried out, according to one aspect of the present disclosure, prior to the step of FIG. 9. In greater detail, following upon the steps of FIGS. 3-7, a step of coupling between the wafer 100 and a wafer 200 is carried out (FIG. 16) (the wafer 200 being, for example, as has been said, made of semiconductor material, such as silicon). Coupling between the wafers 100 and 200 is, for example, obtained using a bonding technique of a glass-frit type (also known as "glass soldering" or "seal glass bonding"), as illustrated in FIG. 16 by means of the coupling regions 201. The coupling obtained by means of glass-frit bonding is of a hermetic type, and the coefficient of thermal expansion of the glass used according to this technique guarantees that the stress transmitted to the wafer 100 is very low, and in any case such as not to generate warpage of the membranes 22.

Following upon the step of FIG. 16, the steps already described with reference to FIGS. 9-15 are carried out. In particular, the step of FIG. 9 comprises coupling, for example by means of a DAF tape or a generic biadhesive tape used for dicing, the ensemble formed by the wafers 100 and 200 and the support 30, for the subsequent step of dicing described with reference to FIG. 10. However, unlike what has been described with reference to FIG. 13, according to this embodiment, the DAF tape does not have the function of sealing layer 32 designed to prevent, subsequently, flow of the adhesive paste into the cavities 24, in so far as this function is already achieved by the wafer 200. Hence, before the step of gluing of each die 36 in the respective package, the DAF tape is removed.

According to a further embodiment of the present disclosure, the sealing layer 32 is a layer of dry resist, laid on the back side 100b of the wafer 100 for example by means of a lamination technique, in itself known. The step of lamination of the layer of dry resist as sealing layer 32 is carried out, in particular, over the entire back side 100b of the wafer 100, following upon the manufacturing step of FIG. 7, and precedes the steps dedicated to dicing described with reference to FIGS. 9-12. The steps of FIGS. 9-12 are carried out as already described. In any case, it is evident that dicing of the wafer 100 obtained with the sealing layer 32 of dry resist can be carried out using a technique different from the one described.

Figure 15:
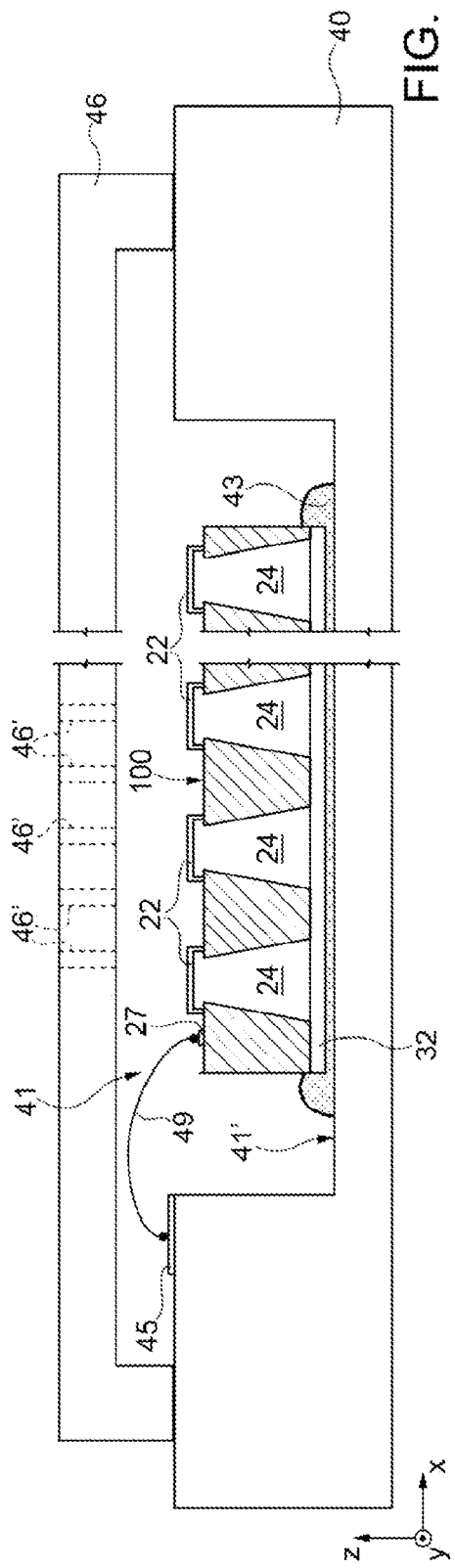

Irrespective of how the steps of dicing of the wafer 100 are performed, the layer of dry resist, laid on the back side 100b of the wafer 100, closes the cavities 24 subtended by each individual membrane 22, and has the function of preventing flow, towards the inside of the cavities 24 themselves, of the adhesive paste used for improving adhesion between the die 36 and the package 16 during the steps described with reference to FIG. 13-15.

It is evident that, according to further embodiments, the sealing layer 32 may be of a material different from those described so far, for example silicon oxide ($SiO_2$), or glass.

The advantages that the disclosure according to the present disclosure affords emerge clearly from the foregoing description.

In particular, the present applicant has found that using a sealing layer 32 as described the phenomena of deformation or warpage of the membrane 22 are significantly reduced as compared to use of a DAF adhesive tape for coupling the die to the corresponding package. In fact, according to one aspect of the present disclosure, coupling (gluing) of the die to the package is not obtained using the DAF tape, which is used (in one embodiment) exclusively as layer for closing the cavities 24 and not as layer for coupling to the package. Coupling between the die and the package are made, in fact, using adhesive paste or glue, which does not generate the aforementioned warpage phenomena. Furthermore, the glue does not penetrate into the cavities 24, thus preventing the undesirable phenomenon of reduction of the internal volume of the cavities 24. Use of the DAF tape as sealing layer 32 is moreover advantageous in so far as it does not require further steps of manufacture as compared to the current state of the art. In fact, according to the known art, a DAF tape (or the like) is in any case used during the step of dicing of the wafer, but is removed before insertion of the die into the package.

The same advantages are achieved using a sealing layer 32 of some other type (for example, as described, made of silicon or dry resist). The embodiment that envisages the use of a semiconductor layer as sealing layer 32 is, however, more costly than the use of a DAF tape or a layer of dry resist.

Finally, it is clear that modifications and variations may be made with respect to what has been described and illustrated herein, without thereby departing from the sphere of protection of the present disclosure.

As has been said, the steps of machining of the wafer 100 to form the MEMS membrane structures 22 and the respective cavities 24 are only provided by way of example of a possible embodiment. The present disclosure, in fact, may be applied to a plurality of MEMS membrane transducers, irrespective of the type of transducer and of the process of manufacture thereof. Also the dicing steps are only examples of a possible embodiment, and any dicing method may be used.

Furthermore, even though the present disclosure has been described with explicit reference to a MEMS speaker, it applies to microphones, pressure sensors, or other transducers in which the phenomenon of warpage due to transmission of the stresses following upon steps of dice bonding is a problem.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged MEMS transducer device comprising:
   a die including:
     a semiconductor body having a first surface and a second surface opposite to one another in a first direction;
     a cavity extending through said semiconductor body between the first surface and the second surface;
     a membrane located at the first surface and at least partially suspended over said cavity; and a sealing layer located on the second surface of the semiconductor body and sealing said cavity, wherein the sealing layer is die-attach film, DAF tape, or dry resist;

a package housing the die, the package having an inner surface and said die located on the inner surface; and an adhesive located between the sealing layer and said inner surface of said package and coupling the die to the package, wherein the sealing layer prevents the adhesive from flowing into the cavity.

2. The device according to claim 1, wherein the adhesive includes an epoxy-based glue, or polyamide-based glue, or acrylic-based glue.

3. The device according to claim 1, wherein said package includes a recess, said die located in said recess, said adhesive extending in said recess.

4. A method for packaging a MEMS transducer device comprising:

forming a die, the forming of the die including:

forming a sealing layer on a first surface of a semiconductor body, said semiconductor body including a second surface, a cavity extending through the semiconductor body from the first surface to the second surface, and a membrane covering the cavity at the second surface, the sealing layer sealing said cavity at the first surface, wherein forming the sealing layer includes one of laminating a die-attach film or DAF tape on the first surface or forming a layer of dry resist on the first surface;

applying an adhesive on at least one of an inner surface of a package and the sealing layer; and coupling the die to the package by placing the sealing layer in contact with the inner surface of the package such that the adhesive couples the die and the package together, wherein the sealing layer prevents the adhesive from flowing into the cavity.

5. The method according to claim 4, wherein forming the sealing layer includes coupling, at the first surface of the semiconductor body, a sealing wafer that includes one of a semiconductor wafer, a silicon-oxide wafer, and a glass wafer.

6. The method according to claim 5, wherein coupling the sealing wafer includes glass-soldering.

7. The method according to claim 4, comprising forming the membrane by depositing and defining lithographically a membrane layer on the second surface of the semiconductor body;

forming the cavity and rendering the membrane partially suspended over the cavity by selectively etching said semiconductor body; and dicing said semiconductor body along scribe lines.

8. The method according to claim 7, wherein forming the sealing layer is carried out before dicing the first semiconductor wafer.

9. The method according to claim 4 further including:

forming a recess in a semiconductor wafer by patterning said semiconductor wafer, wherein applying the adhesive on the inner surface of the package includes applying the adhesive on an inner surface of the recess.

10. The method according to claim 9, wherein applying the adhesive includes laying said glue within the recess.

11. The method according to claim 4, wherein forming the sealing layer on the first surface of the semiconductor body comprises forming the sealing layer on the first surface and covering a plurality of cavities in the semiconductor body.

12. A package comprising:

a semiconductor die having first and second surfaces and a cavity that extends between the first and second surfaces, a membrane that covers the cavity at the first surface;

a sealing layer that covers the cavity at the second surface, wherein the sealing layer is one of a die-attach film, a layer of dry resist, and DAF tape;

a package body having an inner surface, the semiconductor die located on the inner surface of the package body; and an adhesive located between the sealing layer and the inner surface of the package body, the adhesive coupling the semiconductor die to the inner surface of the package body, wherein the sealing layer prevents the adhesive from flowing into the cavity.

13. The package according to claim 12, wherein the package body includes a recess and the inner surface of the package body is a bottom surface of the recess.

14. The package according to claim 12, wherein the cavity is a first cavity, wherein the package body includes a cover located over the inner surface of the package body, the cover and the inner surface of the package body forming a second cavity in which the semiconductor die is located.

* * * * *